(12) United States Patent
Kudo et al.

(10) Patent No.: US 10,692,729 B2
(45) Date of Patent: Jun. 23, 2020

(54) ETCHING PROCESS METHOD

(71) Applicant: Tokyo Electron Limited, Tokyo (JP)

(72) Inventors: Jin Kudo, Miyagi (JP); Wataru Takayama, Miyagi (JP); Maju Tomura, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/625,165

(22) Filed: Jun. 16, 2017

(65) Prior Publication Data

US 2017/0372916 A1 Dec. 28, 2017

(30) Foreign Application Priority Data

Jun. 23, 2016 (JP) ................................. 2016-124600

(51) Int. Cl.
| | |
|---|---|
| H01L 21/67 | (2006.01) |
| H01L 21/3213 | (2006.01) |
| H01L 21/311 | (2006.01) |
| H01L 21/3065 | (2006.01) |
| H01L 21/02 | (2006.01) |
| H01J 37/32 | (2006.01) |

(52) U.S. Cl.
CPC .... *H01L 21/31116* (2013.01); *H01J 37/3244* (2013.01); *H01J 37/32091* (2013.01); *H01J 37/32165* (2013.01); *H01J 37/32724* (2013.01); *H01J 37/32816* (2013.01); *H01L 21/022* (2013.01); *H01L 21/3065* (2013.01); *H01L 21/32136* (2013.01); *H01L 21/67069* (2013.01); *H01L 21/67248* (2013.01); *H01J 37/32642* (2013.01); *H01J 37/32834* (2013.01); *H01J 2237/2001* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 5,302,236 A | * | 4/1994 | Tahara | H01L 21/31144 204/192.35 |
| 5,312,518 A | * | 5/1994 | Kadomura | H01L 21/31116 257/E21.252 |
| 5,830,807 A | * | 11/1998 | Matsunaga | H01L 21/3065 438/714 |
| 8,598,040 B2 | * | 12/2013 | Le Gouil | H01L 21/3065 438/714 |

(Continued)

FOREIGN PATENT DOCUMENTS

| | | |
|---|---|---|
| JP | H03-016210 | 1/1991 |
| JP | H04-084427 | 3/1992 |

(Continued)

*Primary Examiner* — Stephanie P Duclair
(74) *Attorney, Agent, or Firm* — IPUSA, PLLC

(57) ABSTRACT

An etching process method is provided that includes outputting a first high frequency power from a first high frequency power supply in a cryogenic temperature environment where the temperature of a substrate is controlled to be less than or equal to −35° C., supplying a sulfur fluoride-containing gas and a hydrogen-containing gas, generating a plasma from the supplied sulfur fluoride-containing gas and hydrogen-containing gas, and etching a laminated film made up of laminated layers of silicon-containing films having different compositions with the generated plasma.

15 Claims, 7 Drawing Sheets

(56) References Cited

U.S. PATENT DOCUMENTS

| | | | | |
|---|---|---|---|---|
| 2012/0211462 A1* | 8/2012 | Zhang | ............... | H01L 21/31116 216/13 |
| 2014/0302683 A1* | 10/2014 | Kikuchi | ............ | H01L 21/31116 438/718 |
| 2015/0037982 A1* | 2/2015 | Ogawa | .............. | H01J 37/32091 438/715 |

FOREIGN PATENT DOCUMENTS

| | | | |
|---|---|---|---|
| JP | 07147273 | * | 6/1995 |
| JP | 2005-072518 | | 3/2005 |
| JP | 2016-039310 | | 3/2016 |

* cited by examiner

ETCHING PROCESS METHOD

CROSS-REFERENCE TO RELATED APPLICATION

The present application is based on and claims the benefit of priority to Japanese Patent Application No. 2016-124600 filed on Jun. 23, 2016, the entire contents of which are hereby incorporated by reference.

BACKGROUND OF THE INVENTION

1. Field of the Invention

The present invention relates to an etching process method.

2. Description of the Related Art

Techniques for etching a silicon-containing film using a fluorocarbon-based (CF-based) gas are known. Further, techniques for increasing mask selectivity with respect to a silicon-containing film by adding a hydrocarbon-based (CH-based) gas to an etching gas are known.

Also, techniques for increasing mask selectivity with respect to a silicon-containing film using a fluorinated sulfur-containing gas instead of a fluorocarbon-based gas are known (see, e.g., Japanese Unexamined Patent Publication No. H04-84427 and Japanese Unexamined Patent Publication No. 2005-72518).

However, in the above-described etching techniques, the etching gas and process conditions are selected in view of increasing mask selectivity but not in view of suppressing side etching and obtaining a desirable etching profile. As such, the selected etching gas and process conditions may not be appropriate for suppressing side etching and obtaining a desirable etching profile.

Particularly, in manufacturing a three-dimensional (3D) stacked semiconductor memory, such as a 3D NAND flash memory, high aspect ratio etching has to be performed in an etching process for forming a deep hole or a deep trench in a laminated film made up of laminated layers of silicon-containing films with different compositions using a plasma. For example, to form a hole or a trench that penetrates through all layers of a 16-layer or 32-layer laminated film made up of silicon-containing films having different compositions and reaches an underlying film, maintaining verticality of an etching profile is important.

SUMMARY OF THE INVENTION

One aspect of the present invention is directed to providing an etching process method that is capable of maintaining a high etch rate while suppressing side etching.

According to one embodiment of the present invention, an etching process method is provided that includes outputting a first high frequency power from a first high frequency power supply in a cryogenic temperature environment where the temperature of a substrate is controlled to be less than or equal to −35° C., supplying a sulfur fluoride-containing gas and a hydrogen-containing gas, generating a plasma from the supplied sulfur fluoride-containing gas and hydrogen-containing gas, and etching a laminated film made up of laminated layers of silicon-containing films having different compositions with the generated plasma.

DESCRIPTION OF THE PREFERRED EMBODIMENTS

Figure 1:
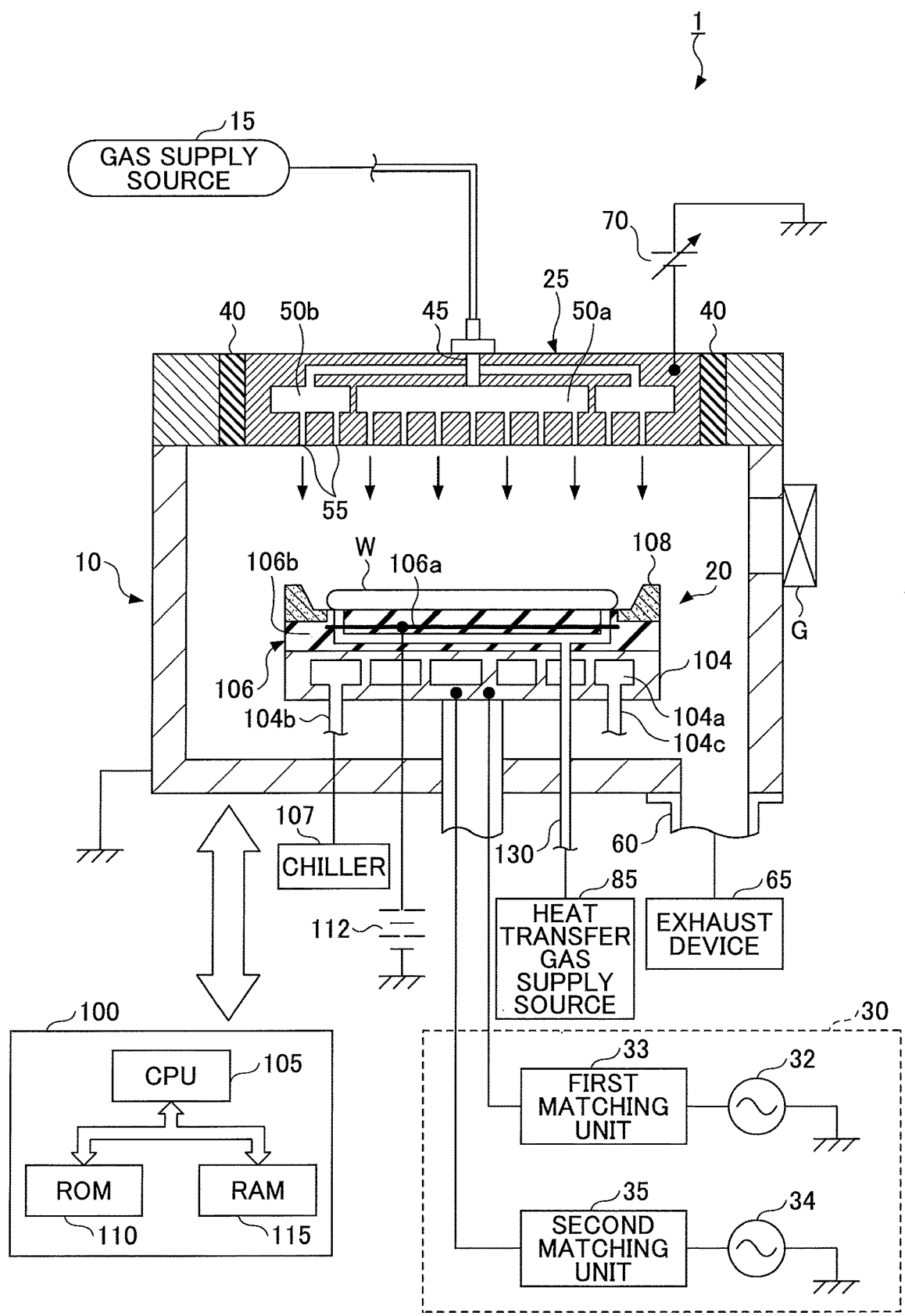
FIG. 1 is a longitudinal cross-sectional view of a plasma processing apparatus according to an example embodiment of the present invention.

In the following, embodiments of the present invention will be described with reference to the accompanying drawings. Note that in the following descriptions and the accompanying drawings, features and elements that are substantially identical are given the same reference numerals and overlapping descriptions thereof may be omitted.

[Overall Configuration of Plasma Processing Apparatus]

In the following, a plasma processing apparatus 1 according to an embodiment of the present invention will be described with reference to FIG. 1. The plasma processing apparatus 1 according to the present embodiment is a capacitively coupled parallel plate plasma processing apparatus that includes a substantially cylindrical processing chamber 10. The inner surface of the processing chamber 10 is subjected to an alumite treatment (anodizing treatment). A plasma process, such as an etching process or a film forming process using plasma, is performed inside the processing chamber 10.

A mounting table 20 for holding a wafer W, as an example of a substrate to be processed, is arranged inside the processing chamber 10. The mounting table 20 may be made of aluminum (Al), titanium (Ti), or silicon carbide (SiC), for example. Note that the mounting table 20 also functions as a lower electrode.

The mounting table 20 includes an electrostatic chuck 106 for electrostatically attracting the wafer W arranged at an upper side of the mounting table 20. The electrostatic chuck 106 includes a chuck electrode 106a that is interposed between insulators 106b. A direct current (DC) voltage source 112 is connected to the chuck electrode 106a. When a DC voltage is applied from the DC voltage source 112 to the chuck electrode 106a, the wafer W is electrostatically attracted to the electrostatic chuck 106 by a Coulomb force.

An annular focus ring 108 is arranged around an outer peripheral portion of the electrostatic chuck 106 to surround the outer edge of the wafer W. The focus ring 108 may be made of silicon, for example. The focus ring 108 converges plasma toward the surface of the wafer W in the processing chamber 10 to thereby improve efficiency of the plasma process performed in the processing chamber 10.

A support 104 is arranged at a lower side of the mounting table 20, and in this way, the mounting table 20 is held at the bottom of the processing chamber 10. A refrigerant flow path 104a is formed inside the support 104. A cooling medium (hereinafter also referred to as "refrigerant"), such as cooling water or brine, that is output from a chiller 107 flows and circulates through a refrigerant inlet pipe 104b, the refrigerant flow path 104a, and a refrigerant outlet pipe 104c. By circulating the refrigerant in the above-described manner, heat may be removed from the mounting table 20 so that the mounting table 20 may be cooled.

The plasma processing apparatus 1 also includes a heat transfer gas supply source 85 that supplies heat transfer gas, such as helium (He) gas or argon (Ar) gas, through a gas supply line 130 to a rear face of the wafer W that is arranged on the electrostatic chuck 106. With such a configuration, the temperature of the electrostatic chuck 106 may be controlled by the refrigerant circulated through the refrigerant flow path 104a and the heat transfer gas supplied to the rear face of the wafer W. In this way, the temperature of the wafer W can be controlled to a predetermined temperature.

Also, a power supply device 30 that supplies dual frequency superimposed power is connected to the mounting table 20. The power supply device 30 includes a first high frequency power supply 32 for supplying plasma generating high frequency power HF (first high frequency power HF) of a first frequency for plasma generation. Further, the power supply device 30 includes a second high frequency power supply 34 for supplying a bias voltage generating high frequency power LF (second high frequency power LF) of a second frequency, which is lower than the first frequency. The first high frequency power supply 32 is electrically connected to the mounting table 20 via a first matching unit 33. The second high frequency power supply 34 is electrically connected to the mounting table 20 via a second matching unit 35. The first high frequency power supply 32 applies the plasma generating high frequency power HF of 40 MHz (as the first frequency), for example, to the mounting table 20. The second high-frequency power supply 34 applies the bias voltage generating high frequency power LF of 3.2 MHz (as the second frequency), for example, to the mounting table 20.

The first matching unit 33 matches the load impedance with the internal (or output) impedance of the first high frequency power supply 32. The second matching unit 35 matches the load impedance with the internal (or output) impedance of the second high frequency power supply 34. The first matching unit 33 functions so that the internal impedance of the first high frequency power supply 32 apparently matches the load impedance when plasma is generated in the processing chamber 10. The second matching unit 35 functions so that the internal impedance of the second high frequency power supply 34 apparently matches the load impedance when plasma is generated in the processing chamber 10.

The gas shower head 25 is arranged at a ceiling portion of the processing chamber 10 to close an opening in the processing chamber 10 via a shield ring 40 that covers the outer edge of the gas shower head 25. A variable DC power supply 70 is connected to the gas shower head 25, and a negative DC (DC voltage) is output from the variable DC power supply 70. The gas shower head 25 may be made of silicon, for example. Note that the gas shower head 25 also functions as a counter electrode (upper electrode) facing the mounting table 20 (lower electrode).

A gas introduction port 45 for introducing gas into the processing chamber 10 is formed in the gas shower head 25. Also, a center-side diffusion chamber 50a and an edge-side diffusion chamber 50b branching from the gas introduction port 45 are formed inside the gas shower head 25. A processing gas output from a gas supply source 15 is supplied to the diffusion chambers 50a and 50b via the gas introduction port 45 to be diffused in the diffusion chambers 50a and 50b after which the processing gas is introduced into the processing chamber 10 toward the mounting table 20 through multiple gas supply holes 55 that are formed in the gas shower head 25.

An exhaust port 60 is formed on a bottom surface of the processing chamber 10, and an exhaust device 65 is connected to the exhaust port 60 so that gas inside the processing chamber 10 may be evacuated. In this way, the interior of the processing chamber 10 can be maintained at a predetermined degree of vacuum. A gate valve G is arranged on a side wall of the processing chamber 10. The gate valve G opens and closes when loading/unloading the wafer W into/out of the processing chamber 10.

The plasma processing apparatus 1 also includes a control unit 100 for controlling overall operations of the plasma processing apparatus 1. The control unit 100 includes a CPU (Central Processing Unit) 105, a ROM (Read Only Memory) 110, and a RAM (Random Access Memory) 115. The CPU 105 executes a desired process, such as an etching process, according to a recipe stored in a storage area of the RAM 115, for example. The recipe specifies control information for the plasma processing apparatus 1 to execute the desired process including predetermined process conditions, such as process time, pressure (gas exhaust), high frequency power and voltage, flow rates of various gases, internal temperature of the processing chamber (upper electrode temperature, side wall temperature, wafer W temperature, electrostatic chuck temperature, etc.), and refrigerant temperature of the refrigerant output from the chiller 107, for example. Note that such recipe describing process conditions and/or other programs may be stored in a hard disk or a semiconductor memory, for example. The recipe may also be stored in a portable computer-readable storage medium, such as a CD-ROM or a DVD, and may be read out by setting the storage medium in the plasma processing apparatus 1 at a predetermined position, for example.

When a plasma process is executed, the gate valve G is controlled to open/close, the wafer W is carried into the processing chamber 10 and placed on the mounting table 20. When a DC voltage is applied from the DC voltage source 112 to the chuck electrode 106a, the wafer W is electrostatically attracted to the electrostatic chuck 106 and held by the electrostatic chuck 106.

A processing gas from the gas supply source 15 is supplied to the processing chamber 10. The first high frequency power from the first high frequency power supply 32 is applied to the mounting table 20 and the second high frequency power from the second high frequency power supply 34 is applied to the mounting table 20. A negative DC (DC voltage) from the variable DC power supply 70 is applied to the gas shower head 25. In this way, a plasma is generated above the wafer W, and a plasma process is performed on the wafer W by the action of the generated plasma.

After the plasma process, a DC voltage with a polarity that is opposite the polarity of the DC voltage applied to the wafer W upon electrostatically attracting the wafer W to the electrostatic chuck 106 is applied from the DC voltage source 112 to the chuck electrode 106a such that the electric charge of the wafer W is eliminated. In this way, the wafer W is removed from the electrostatic chuck 106 and carried out of the processing chamber 10 via the gate valve G. The plasma processing apparatus 1 according to the present embodiment having the configuration as described above can be used to perform an etching process at a cryogenic temperature using a predetermined etching gas supplied from the gas supply source 15.

[Etching at Cryogenic Temperature]

In the following, an etching process at a cryogenic temperature according to a first embodiment of the present invention is described by comparing example etching results of performing the etching process according to the first embodiment with example etching results of performing etching processes according to Comparative Example 1 and Comparative Example 2.

Comparative Example 1

In Comparative Example 1, an etching process is performed on a laminated film 12 made up of laminated layers of a silicon oxide ($SiO_2$) film and a silicon nitride (SiN) film under the following process conditions. The laminated film 12 is an example of a laminated film made up of laminated layers of silicon-containing films having different compositions. Also, an amorphous carbon film 11 that is used as a mask is formed on the laminated film 12. Note, however, that the mask is not limited to the amorphous carbon film 11, and may alternatively be an organic film, for example.

Process Conditions (Comparative Example 1)

| Wafer Temperature | −40° C. or lower (Chiller Temperature: −60° C.) |
| --- | --- |
| Gas | $CF_4$ (carbon tetrafluoride)/$CH_4$ (methane)/$O_2$ (oxygen) |
| First High Frequency Power HF | 2500 W, continuous wave |
| Second High Frequency Power LF | 4000 W, continuous wave |

Comparative Example 2

In Comparative Example 2, an etching process is performed on the laminated film 12 under the following process conditions.

Process Conditions (Comparative Example 2)

| Wafer Temperature | −40° C. or lower (Chiller Temperature: −60° C.) |
| --- | --- |
| Gas | $H_2$ (hydrogen)/$CF_4$ (carbon tetrafluoride)/$CHF_3$ (methane trifluoride) |
| First High Frequency Power HF | 2500 W, continuous wave |
| Second High Frequency Power LF | 4000 W, continuous wave |

Figure 2:
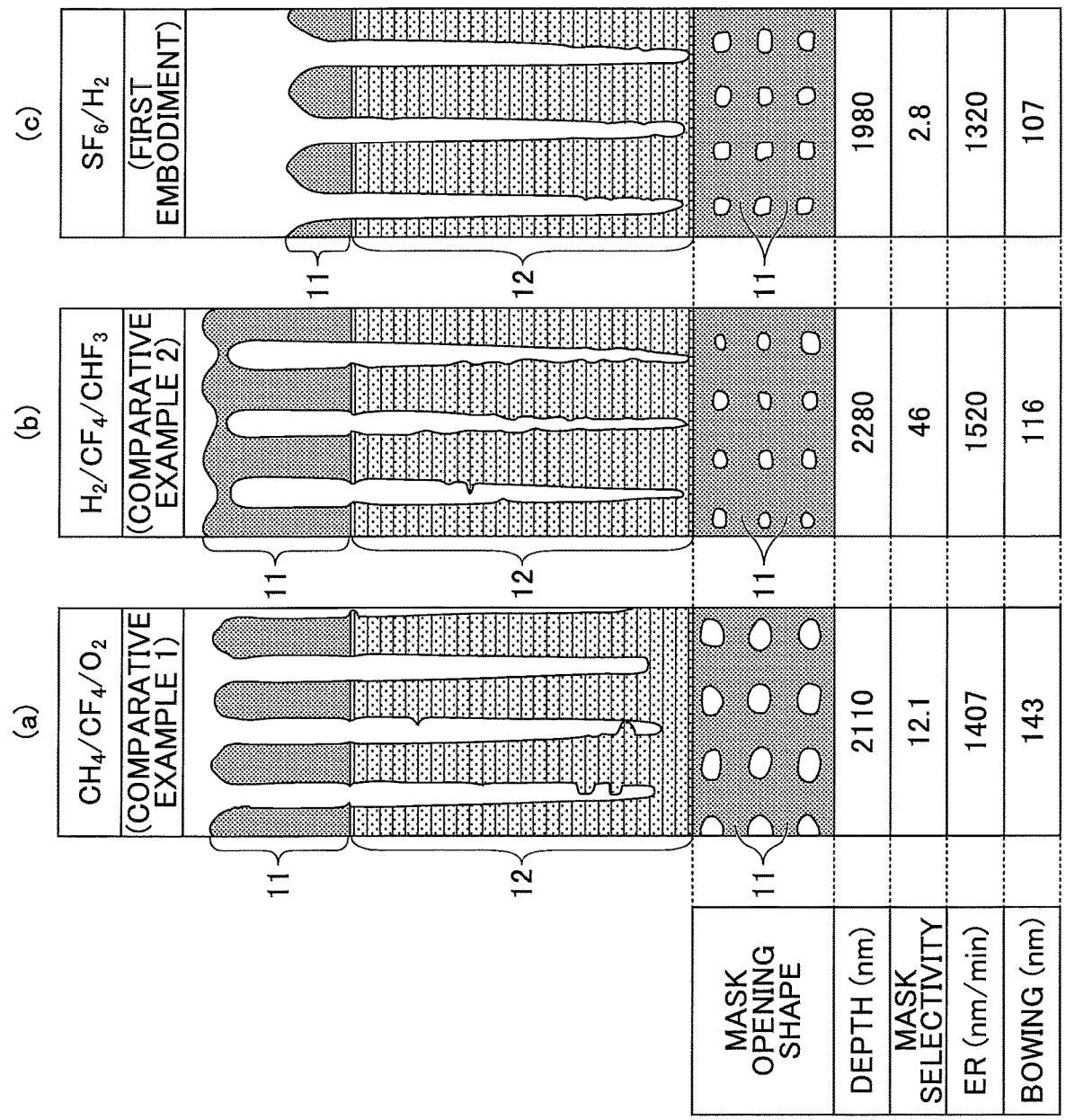
FIG. 2 is a diagram showing example results of etching a laminated film with gas according to Comparative Example 1, Comparative Example 2, and a first embodiment of the present invention.

In FIG. 2, (a) shows an example etching result of performing the etching process according to Comparative Example 1, (b) shows an example etching result of performing the etching process according to Comparative Example 2. The etching results (a) and (b) of FIG. 2 include longitudinal cross-sectional views of etching profiles of holes formed in the laminated film 12 as a result of etching the laminated film 12 using the amorphous carbon film 11 as a mask, and top views of openings in the amorphous carbon film 11. Also, numeric values representing etching depth (nm), mask selectivity, etch rate (ER) (nm/min), and bowing (nm) are indicated. Note that "bowing" in the etching results represents to a dimension in the lateral direction of a widest portion of the hole. Bowing is a phenomenon in which variations occur in the etching profile of a hole as a result of side etching of the hole.

As can be appreciated from the etching results (a) and (b) of FIG. 2, in the etching processes according to Comparative Example 1 and Comparative Example 2, desirable mask selectivity can be obtained while maintaining the etching depth and the etch rate (ER). However, bowing occurs as a result of side etching of the hole in the etching results (a) and (b) of FIG. 2. Further, in the etching result (b) of FIG. 2, the opening in the amorphous carbon film 11 is clogged.

First Embodiment

In the first embodiment of the present invention, the laminated film 12 is etched under the following process conditions.

Process Condition (First Embodiment)

| Wafer Temperature | −40° C. or lower (Chiller Temperature: −60° C.) |
| --- | --- |
| Gas | $SF_6$ (sulfur hexafluoride)/$H_2$ (hydrogen) |
| First High Frequency Power HF | 2500 W, continuous wave |
| Second High Frequency Power LF | 4000 W, continuous wave |
| Processing Chamber Internal Pressure | 15 to 25 mTorr (2.0 to 3.3 Pa) |

Note that in the first embodiment and further embodiments of the present invention described below, the first high frequency power HF and the second high frequency power LF are applied. However, the present invention is not limited thereto, and in some embodiments, only the first high frequency power HF may be applied, for example.

In FIG. 2, (c) shows an example etching result of performing the etching process according to the first embodiment. By comparing the etching result (c) of the first embodiment with the etching results (a) and (b) of Comparative Examples 1 and 2 of FIG. 2, it can be appreciated that in the etching process according to the first embodiment, side etching can be suppressed and the etching profile can be improved while maintaining the etching depth and the etch rate. Also, in the etching result (c) of the etching process according to the first embodiment, the openings in the amorphous carbon film 11 are not clogged and the shapes of the openings can be desirably maintained. In this way, transfer accuracy may be improved in transferring the mask pattern of the amorphous carbon film 11 to the laminated film 12 and desirable etching can be performed. Note that although the mask selectivity in the etching process according to the first embodiment is decreased as compared with Comparative Examples 1 and 2, a hole with a required depth can be formed before the amorphous carbon film 11 is etched away. However, in a preferred embodiment, as described below with reference to a second embodiment of the present invention, a mask selectivity of at least 5.0 is desired.

As described above, according to the etching method of the first embodiment, $SF_6$ (sulfur hexafluoride) gas is supplied as an example of a sulfur fluoride-containing gas and $H_2$ (hydrogen) gas is supplied as an example of a hydrogen-containing gas. Then, the laminated film 12 is etched mainly by a plasma generated from the supplied gas by the energy of the first high frequency power HF. In this way, etching is promoted mainly by the F component of $SF_6$, and a protective film is formed on the side wall of the etched hole mainly by the S component of $SF_6$ such that side etching can be suppressed. Also, etching is performed in a cryogenic temperature environment in which the temperature of the wafer W is controlled to be less than or equal to −35° C. such that a high etch rate can be maintained, and in this way, a deep hole having a desirable etching profile can be formed.

Note that although sulfur (S) adheres to the bottom surface of the etched hole to form a protective film in the present embodiment, the interior of the processing chamber 10 is controlled to a low pressure (about 15 to 60 mTorr; i.e., about 2.0 to 8.0 Pa), and as such, ions having a high rectilinearity in the plasma can reach the bottom surface to thereby promote etching of the bottom surface of the hole and the mask surface of the amorphous carbon film 11.

In this way, side etching can be suppressed and the etching profile can be improved while maintaining a high etch rate. Also, the shape of the opening in the amorphous carbon film 11 can be improved.

Also, according to the etching process method of the first embodiment, the gas that is supplied does not contain C (carbon) gas. In this way, the amount of carbon contained in the reaction product generated by etching can be reduced, and adhesion of the reaction product to an inner wall of an etched hole or the like can be reduced. Further, roughening of the mask shape of the amorphous carbon film 11 by carbon can be suppressed.

Also, by maintaining the temperature of the wafer W at −40° C. (−35° C. or lower), sulfur (S) formed on the inner wall of the hole by the etching process may not be volatilized and remain in a solid state to act as a protective film, and sulfur (S) adhered to the inner wall of the processing chamber 10 can be volatilized by controlling the temperature of the inner wall to be at least 70° C., and the volatized sulfur (S) may be discharged and removed from the processing chamber 10 so as to prevent the sulfur (S) from adhering to the inner wall of the processing vessel 10.

Also, by supplying the $H_2$ gas together with the $SF_6$ gas, gas may be more efficiently discharged from the processing chamber 10 to the exterior. Note that in some embodiments, HF (hydrogen fluoride) gas or $NH_3$ (ammonia) gas may be supplied instead of the $H_2$ gas, for example.

Second Embodiment

In the second embodiment, an etching process is performed on the laminated film 12 under the following process conditions.

Process Conditions (Second Embodiment)

| | |
|---|---|
| Wafer Temperature | −40° C. or lower (Chiller Temperature: −60° C.) |
| Gas | $SF_6$ (sulfur hexafluoride)/$CH_4$ (methane) |
| First High Frequency Power HF | 2500 W, continuous wave |
| Second High Frequency Power LF | 4000 W, continuous wave |
| Processing Chamber Internal Pressure | 15 to 25 mTorr (2.0 to 3.3 Pa) |

Figure 3:
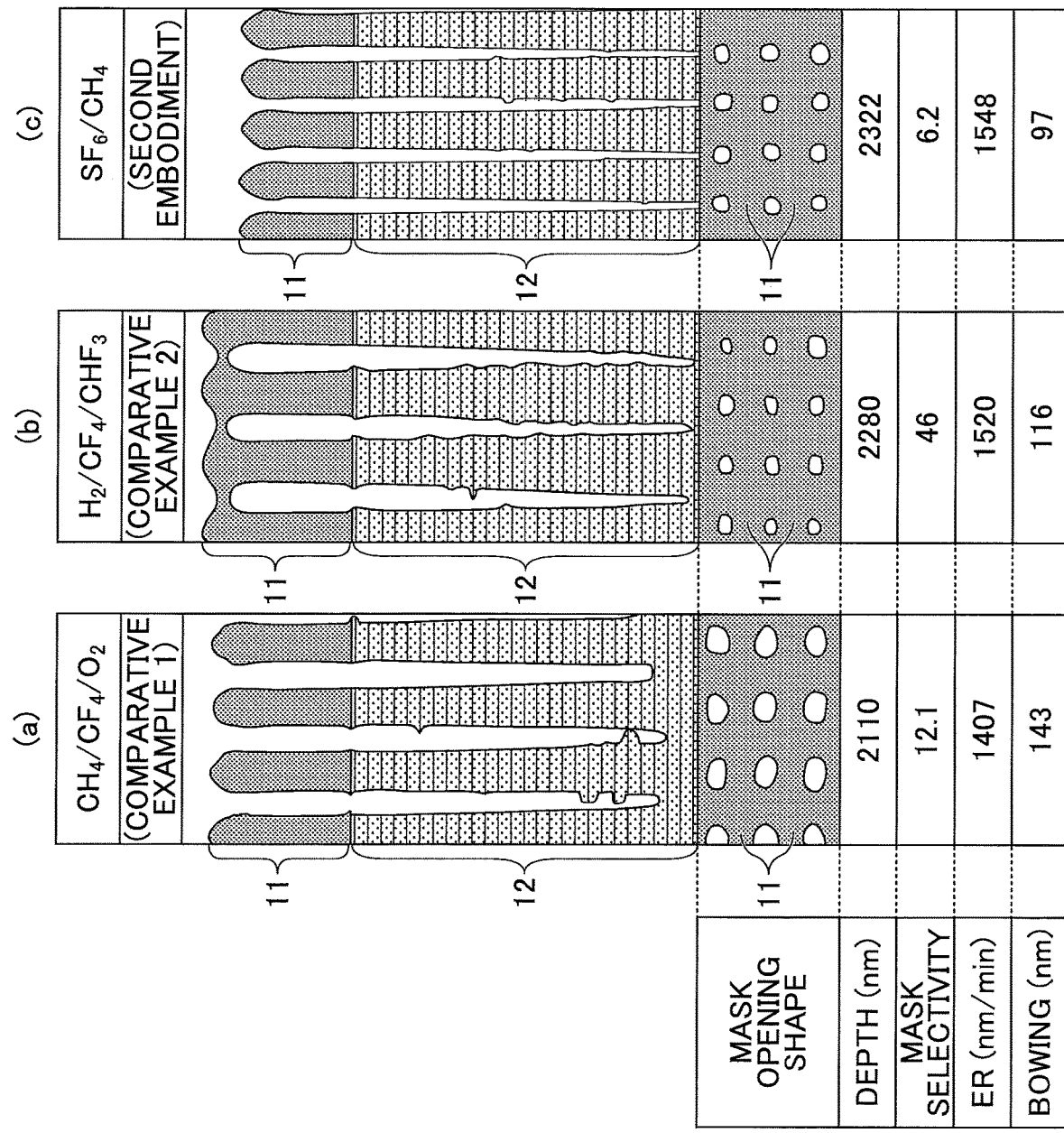
FIG. 3 is a diagram showing example results of etching a laminated film with gas according to Comparative Example 1, Comparative Example 2, and a second embodiment of the present invention.

In FIG. 3, (c) shows an example etching result of performing the etching process according to the second embodiment. Note that (a) and (b) of FIG. 3 correspond to the same etching results of Comparative Examples 1 and 2 that are shown in FIG. 2. By comparing the etching result (c) of the etching process according to the second embodiment shown in FIG. 3 with the etching results (a) and (b) of Comparative Examples 1 and 2 of FIG. 3, it can be appreciated that in the etching process according to the second embodiment, side etching can be suppressed and the etching profile can be improved while maintaining the etching depth and the etch rate (ER).

Also, by comparing the etching result (c) of the etching process according to the second embodiment shown in FIG. 3 with the etching result (c) of the etching process according to the first embodiment as shown in FIG. 2, it can be appreciated that the etch rate (ER) can be increased and the etching depth can be increased in the etching process according to the second embodiment with respect to the etching process according to the first embodiment. Also, side etching can be more effectively suppressed and the etching profile can be further improved as compared with the etching process according to the first embodiment. Also, it can be appreciated from the etching result (c) of the etching process according to the second embodiment that the openings in the amorphous carbon film 11 are not clogged and desirable shapes of the openings can be maintained. In this way, transfer accuracy in transferring the mask pattern of the amorphous carbon film 11 to the laminated film 12 can be improved and etching can be desirably performed.

Also, in the second embodiment, a mask selectivity of at least 5.0 is obtained. Such an increase in the mask selectivity may be attributed to the supply of $CH_4$ gas, which is an example of a hydrocarbon gas, in the etching process according to the second embodiment. That is, by supplying the $CH_4$ gas, carbon may be deposited on the amorphous carbon film 11 to thereby increase the mask selectivity.

As described above, according to the etching process method of the second embodiment, $SF_6$ gas is supplied as an example of a sulfur fluoride-containing gas and $CH_4$ gas is supplied as an example of a hydrogen-containing gas. Then, the laminated film 12 is etched by a plasma generated from the supplied gas. In this way, etching is promoted mainly by the F component of $SF_6$, and a protective film is formed on a side wall of the etched hole mainly by the S component of $SF_6$ so that side etching of the hole can be suppressed. Also, by performing the etching process in a cryogenic temperature environment where the temperature of the wafer W is controlled to be −35° C. or lower, a high etch rate can be maintained, and in this way, a deep hole having desirable etching profile can be formed.

Also, the shapes of the openings in the amorphous carbon film 11 can be improved, and transfer accuracy of the mask pattern of the amorphous carbon film 11 to the laminated film 12 can be improved to thereby realize desirable etching.

Note that although $CH_4$ gas is supplied in the above-described embodiment, other hydrocarbon gases may be supplied instead of the $CH_4$ gas. Other hydrocarbon gases that may be used include a hydrocarbon gas ($C_xH_yF_z$) that can be attached to the wafer W that is cooled to a cryogenic temperature of −35° C. or lower. Specifically, the hydrocarbon gas ($C_xH_yF_z$) is preferably a gas having a high depositing property and poor coverage that would not be easily deposited on the bottom surface of an etched hole.

[Etching Process at Cryogenic Temperature]

In the following, an example etching process according to a modified example will be described with reference to FIG.

Figure 4:
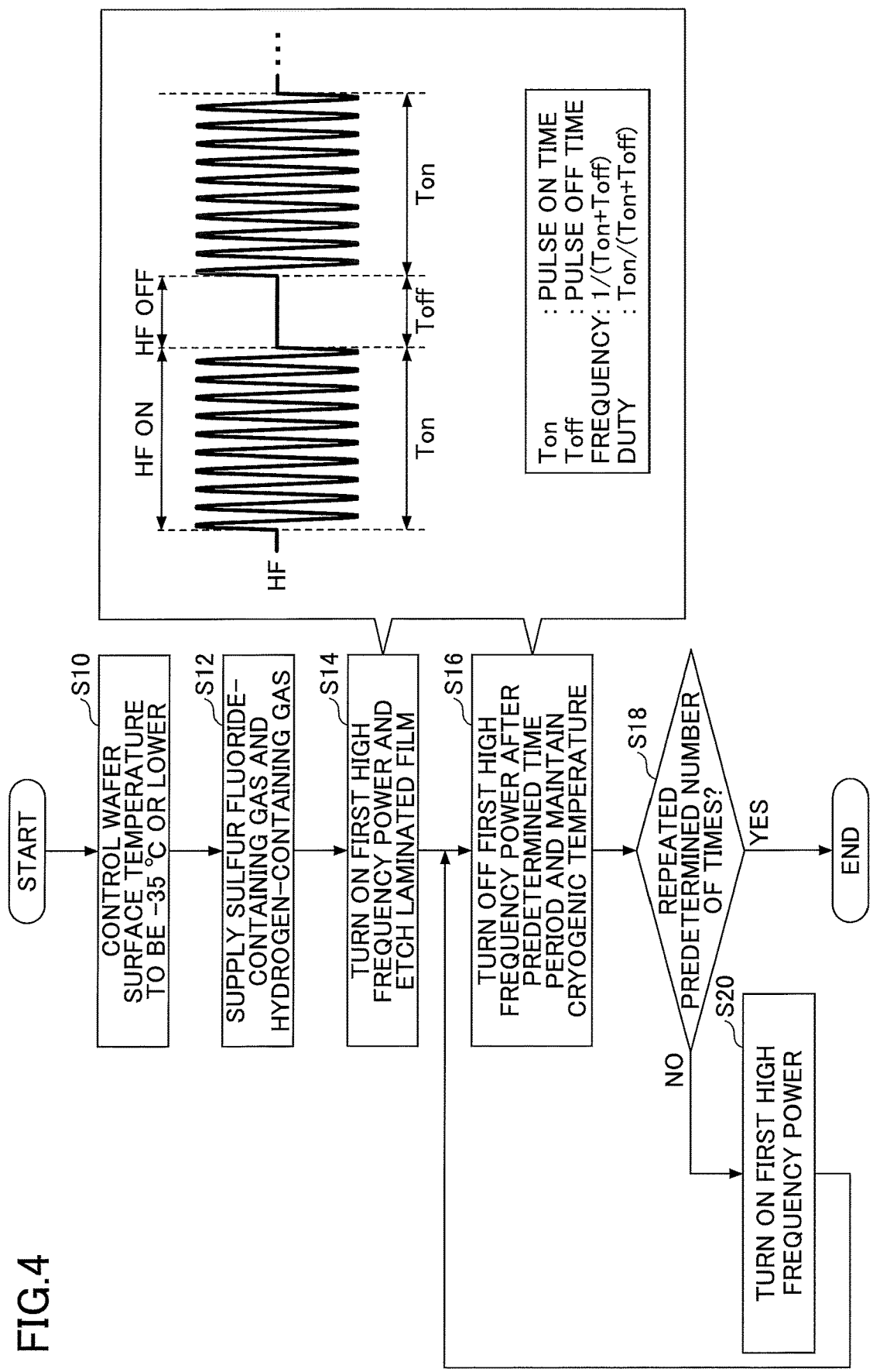
FIG. 4 is a flowchart showing an example etching process according to a modified example.

4. FIG. 4 is a flowchart showing an example etching process according to the modified example. When the process of FIG. 4 is started, the control unit 100 controls the wafer surface temperature to a cryogenic temperature of −35° C. or lower (step S10). Then, the control unit 100 supplies the a sulfur fluoride-containing gas and a hydrogen-containing gas to the interior of the processing chamber 10 (step S12). Note that the gas supplied in step S12 may be, for example, sulfur hexafluoride ($SF_6$) gas and hydrogen ($H_2$) gas, which are the gases supplied in the etching process according to the first embodiment, or sulfur hexafluoride ($SF_6$) gas and $CH_4$ (methane) gas, which are the gases supplied in the etching process according to the second embodiment.

Then, the control unit 100 outputs the first high frequency power HF from the first high frequency power supply 32, applies (turns on) the first high frequency power HF for plasma excitation to the mounting table 20, and etches the laminated film 12 (step S14). At this time, the first high frequency power HF may be a continuous wave or a pulsed wave. In the present modified example, the second high frequency power LF is not output from the second high frequency power supply 34. However, in other examples, the second high frequency power LF may be output from the second high frequency power supply 34, and the second high frequency power LF for biasing may be applied to the mounting table 20. Also, the timing of outputting the second high frequency power LF may be in sync with the first high frequency power HF, for example.

Then, after a predetermined time period elapses, the control unit 100 stops (turns off) application of the first high frequency power HF so that the cryogenic temperature can be maintained (step S16). Then, the control unit 100 determines whether the number of times the first high frequency power HF has been repeatedly turned on/off exceeds a predetermined number (step S18). The predetermined number may be any number greater than or equal to two that is set up in advance. If it is determined that the number of times the first high frequency power HF has been repeatedly turned on/off does not exceed the predetermined number, the control unit 100 applies the first high frequency power HF once again to etch the laminated film 12 (step S20). The processes of steps S16 to S20 are repeated until the number of times the first high frequency power HF has been repeatedly turned on/off exceeds the predetermined number, and when it is determined that the number of times the on/off operations of the first high frequency power HF has been repeated exceeds the predetermined number, the present process is ended.

In the etching process method shown in FIG. 4, the first high frequency power HF is intermittently applied by repeating the on/off operations of the first high frequency power HF. In the present example, assuming "Ton" denotes the time during which the first high frequency power HF is being applied (on time), and "Toff" denotes the time during which the first high frequency power HF is not applied (off time), a pulsed wave of the first high frequency power HF having a frequency of 1/(Ton+Toff) is applied. Also, the duty ratio is represented by the ratio of the on time "Ton" to a total time of the on time "Ton" and the off time "Toff", i.e., Ton/(Ton+Toff).

[Transition of Wafer Temperature During Cryogenic Process]

Figure 5:
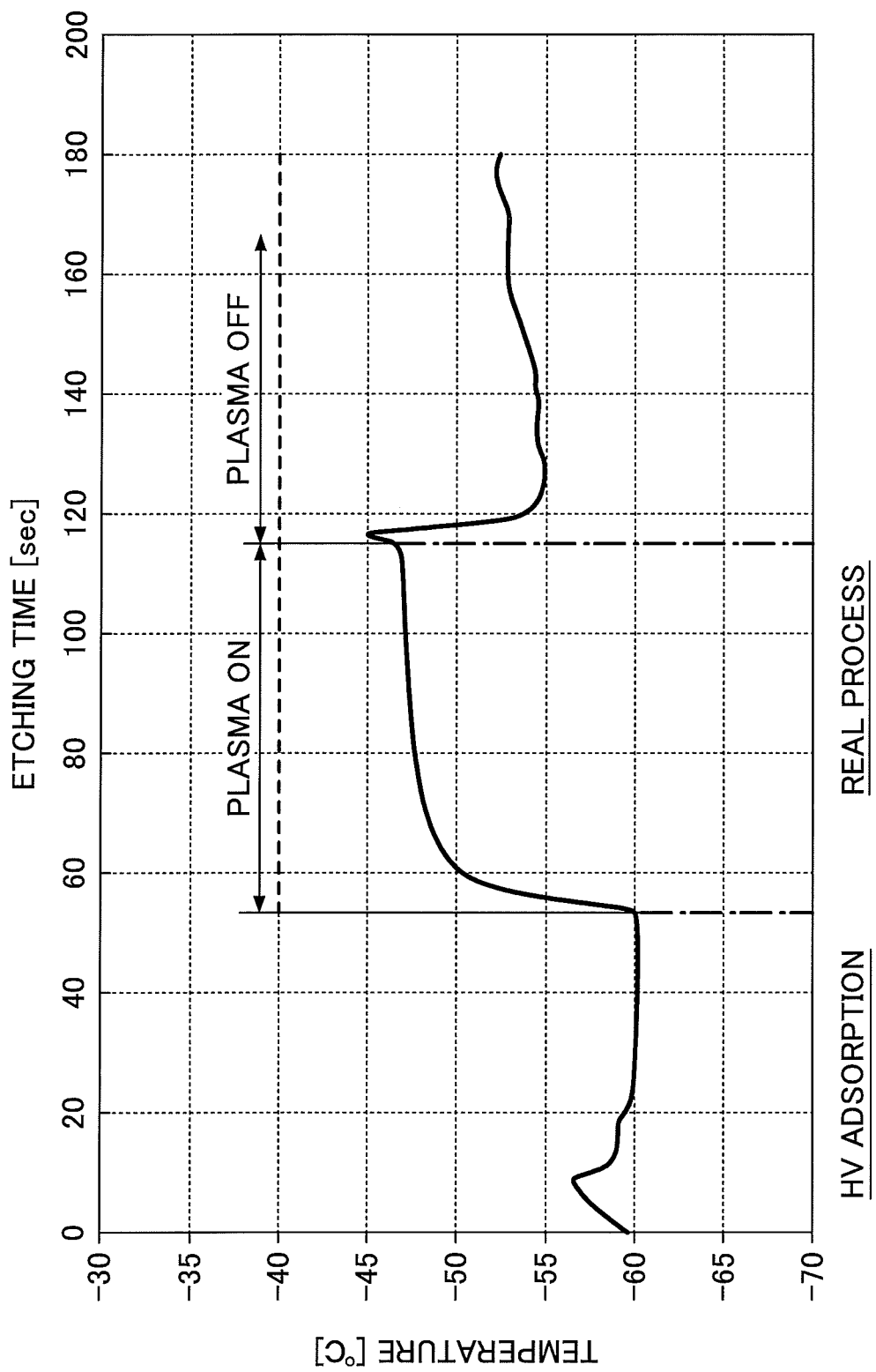
FIG. 5 is a diagram showing an example temperature transition of a wafer that is subjected to the etching process performed in a cryogenic temperature environment according the modified example.

FIG. 5 shows an example temperature transition of the surface of the wafer W while the intermittent etching process of repeatedly turning on/off the first high frequency power HF as shown in FIG. 4 is performed of the wafer W. When the first high frequency power HF is applied (turned on) while the wafer W is being held by the electrostatic chuck 106, a plasma is generated and etching is started. When the first high frequency power HF is applied and the plasma is generated in this manner, the temperature of the wafer W gently increases due to heat input from the plasma (see "PLASMA ON" of FIG. 5). However, by controlling the temperature of the chiller 107 to be −60° C. or lower, the temperature of the wafer W can be maintained at −35° C. or lower.

When application of the first high frequency power HF is stopped during the etching process, the temperature of the wafer W rapidly drops. Note that FIG. 5 shows an example temperature transition of the surface of the wafer W that is carried outside after the first high frequency power HF is turned off. Thus, the surface temperature of the wafer W after the first high frequency power HF is turned off increases. In the intermittent etching process according to the modified example, plasma on/off operations as shown in FIG. 5 are repeatedly performed in response to on/off operations of the first high frequency power HF.

[Cryogenic Process]

Figure 6:
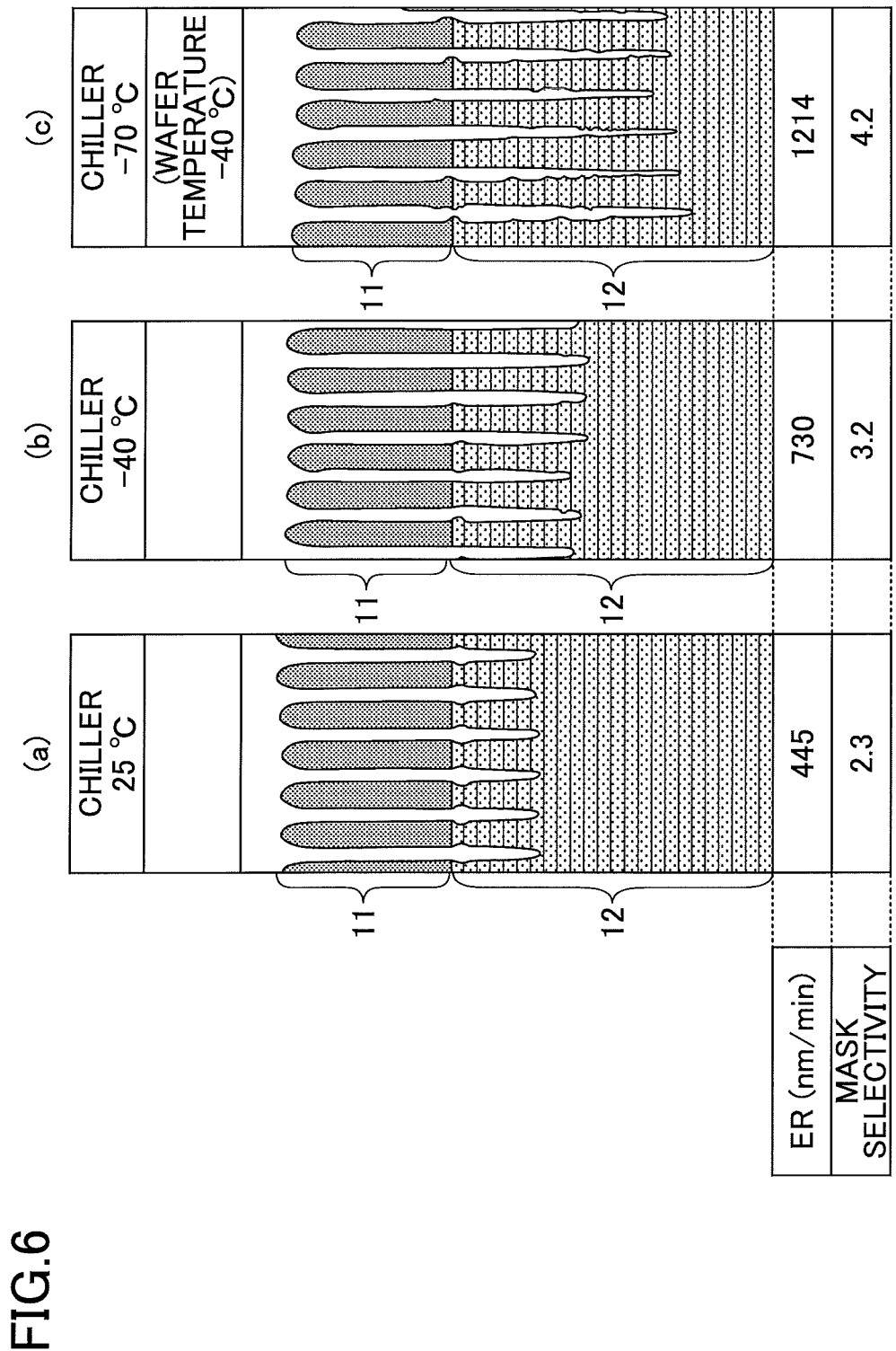
FIG. 6 is a diagram showing example results of etching a laminated film in a cryogenic temperature environment according to a third embodiment of the present invention.

FIG. 6 shows example etching results of etching processes performed under different chiller temperatures. In FIG. 6, (c) shows an example etching result of performing a cryogenic etching process according to a third embodiment of the present invention where the temperature of the wafer W is controlled to be −40° C. or lower by controlling the temperature of the chiller 107 to be −70° C. In the present embodiment, an etching process is performed on the laminated film 12 made up of laminated layers of a silicon oxide film and a silicon nitride film using the amorphous carbon film 11 as a mask under the following process conditions.

Process Condition (Third Embodiment)

| | |
|---|---|
| Wafer Temperature | −40° C. or lower (Chiller Temperature: −60° C.) |
| Gas | $SF_6$ (sulfur hexafluoride)/$H_2$ (hydrogen)/$CH_4$ (methane) |
| First High Frequency Power HF | 2500 W, continuous wave |
| Second High Frequency Power LF | 4000 W, continuous wave |
| Processing Chamber Internal Pressure | 15 to 25 mTorr (2.0 to 3.3 Pa) |

In FIG. 6, (a) shows an example etching result of an etching process in which the temperature of the chiller 107 is controlled to be 25° C., and (b) shows an example etching result of an etching process in which the temperature of the chiller 107 is controlled to be −40° C.

In the etching processes of (a) and (b) in FIG. 6, the temperature of the wafer W cannot be maintained at −40° C. or lower. That is, (a) and (b) of FIG. 6 show example etching results of etching processes that are not performed in a cryogenic process environment.

By comparing the etching result (c) with the etching results (a) and (b) in FIG. 6, it can be appreciated that when an etching process is performed in a cryogenic temperature environment in which the temperature of the wafer W is controlled to be −40° C. or lower, a higher etch rate can obtained and the mask selectivity can be increased.

Specifically, by comparing the etching result of the etching process performed in a cryogenic temperature environment as shown in (c) of FIG. 6 with the etching result of the etching process performed in a room temperature environment as shown in (a) of FIG. 6, it can be appreciated that the etch rate in (c) is about 3 times the etch rate in (a), and the mask selectivity in (c) is about 2 times the mask selectivity in (a). Also, by comparing the etching result (c) with the etching result of the etching process performed in a low temperature environment as shown in (b) of FIG. 6, it can be appreciated that the etch rate in (c) is about 1.7 times the etch rate in (b), and the mask selectivity in (c) is about 1.5 times the mask selectivity in (b).

In the above-described embodiments and modified example, when performing an etching process by supplying sulfur fluoride-containing gas and hydrogen-containing gas and etching the wafer W with plasma generated from the supplied gas, etching is performed in a cryogenic temperature environment where the temperature of the wafer W is −35° C. or lower, and this way, the above-mentioned advantageous effects may be obtained.

[Vapor Pressure Curve]

In the etching process according the above embodiments and modified example, at least one of $H_2$ gas and $CH_4$ gas is supplied as an example of a hydrogen-containing gas, and $SF_6$ gas is supplied as an example of a sulfur fluoride-containing gas. As a result, $H_2O$ is generated as a reaction product by H (hydrogen) contained in the $H_2$ gas and the $CH_4$ gas and O (oxygen) contained in the silicon oxide film in the laminated film 12.

Figure 7:
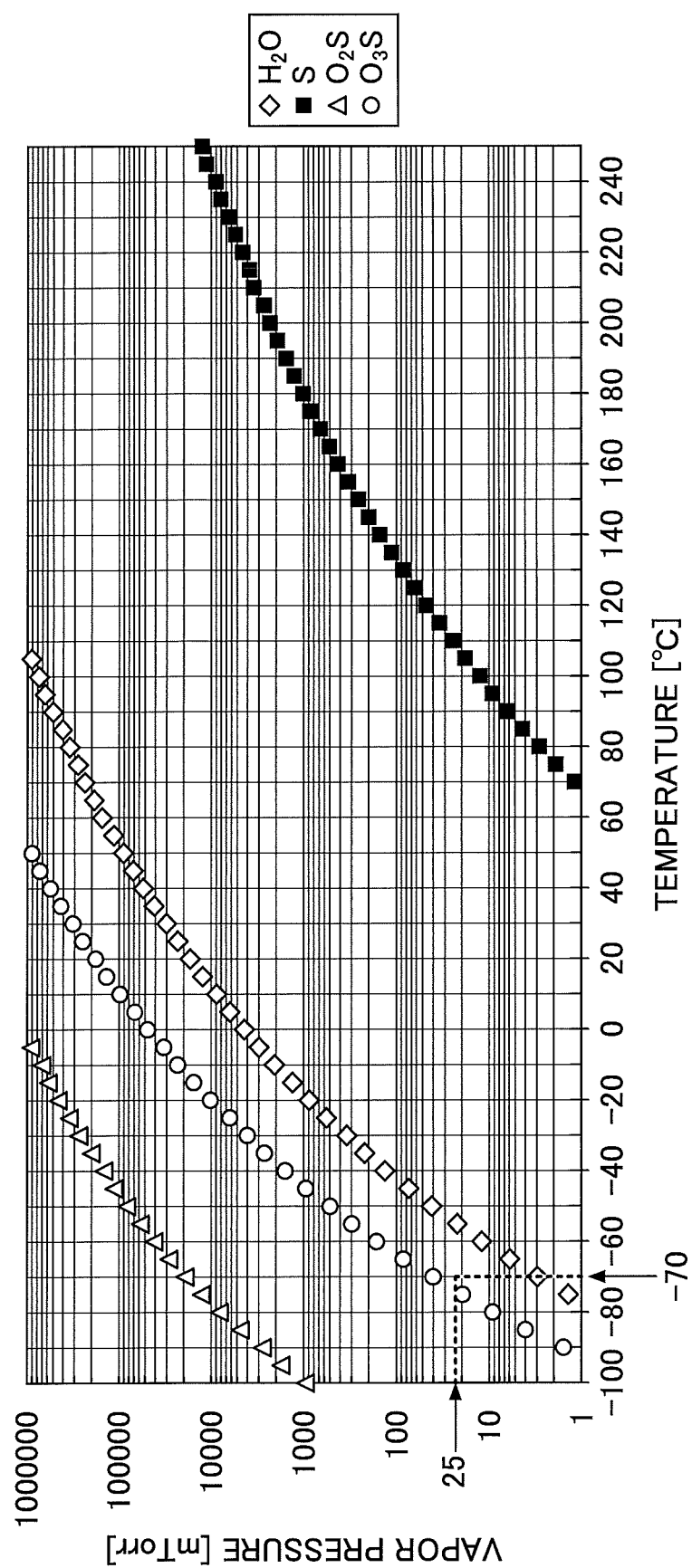
FIG. 7 is a diagram showing vapor pressure curves.

FIG. 7 shows vapor pressure curves of various substances. Note that on the vapor pressure curves, corresponding substances may exist in both liquid and vapor states. According to the vapor pressure curve of water ($H_2O$) in FIG. 7, the saturation vapor pressure of $H_2O$ is low. For example, if the pressure during an etching process is maintained at 3.3 Pa (25 mTorr) and the chiller temperature is set to a cryogenic temperature of about −60° C. to −70° C., $H_2O$ on the surface of the laminated film 12 may be saturated to thereby be in a liquid state.

Liquid on the surface of the laminated film 12 includes F radicals generated from a reaction with $SF_6$ gas in addition to water ($H_2O$) as the reaction product of hydrogen (H) and oxygen (O) as described above. As a result, hydrofluoric acid (HF) is generated by the F radicals and water ($H_2O$). In this way, etching primarily by a chemical reaction is promoted by the hydrofluoric acid dissolved in water on the surface of the silicon oxide film, and the etch rate is specifically increased. That is, by performing etching in a cryogenic temperature environment as shown in (c) of FIG. 6, owing primarily to the chemical reaction induced by the action of the hydrofluoric acid liquid existing on the surface of the silicon oxide film, the etch rate can be increased to about 3 times the etch rate of etching performed in a room temperature environment as shown in (a) of FIG. 6, and about 1.7 times the etch rate of etching performed in a low temperature environment as shown in (b) of FIG. 6.

Also, according to the vapor pressure curve of sulfur (S) in FIG. 7, by controlling the internal pressure of the processing chamber 10 to a high vacuum in a range from 15 to 25 mTorr (2.0 to 3.3 Pa), and controlling the temperature of the wafer W to 0° C. or lower, for example, sulfur (S) may remain a solid on an etching wall of a hole formed in the wafer W. Further, according to the vapor pressure curve of sulfur (S) in FIG. 7, when the temperature of the inner wall of the processing chamber 10 is controlled to be about 70° C., volatilization of sulfur (S) occurs. In this way, side etching may be suppressed by the protective film of sulfur (S) in the hole, and sulfur (S) adhered to the side wall of the processing chamber 10 may be volatilized and discharged to thereby remove the sulfur on the inner wall of the processing chamber 10.

As described above, in the etching process methods according to the above-described embodiments and modified example, an etching process is performed in a cryogenic temperature environment in which the temperature of the wafer W is controlled to be −35° C. or lower, and in this way, side etching may be suppressed while maintaining a desirable mask shape and a high etch rate so that a desirable etching profile can be obtained. Thus, the etching process methods according to the above embodiments and modified example may be suitably implemented in a process of etching a fine hole having an aspect ratio of 20 or higher, for example.

Although an etching process method according to the present invention has been described above with respect to illustrative embodiments and examples, the etching process method according to the present invention is not limited to the above-described embodiments and examples, and various modifications and variations may be made within the scope of the present invention. Also, the above-described embodiments and modifications can be combined to the extent practicable.

For example, although $SF_6$ gas is used as the sulfur fluoride-containing gas for etching in the above-described embodiments, the sulfur fluoride-containing gas is not limited thereto and other $S_xF_y$ gases may be used. Examples of sulfur fluoride-containing ($S_xF_y$) gases that may be used include $S_2F_2$, $SF_3$, $SF_6$, $SF_4$, and $S_8F_{10}$.

Also, in some embodiments, a hydrocarbon-containing gas may be supplied as the hydrogen-containing gas. For example, the hydrocarbon-containing gas used may be at least one of $CH_4$ (methane), $C_2H_8$, $C_2H_2$ (acetylene), $C_2H_4$ (ethylene), $C_2H_6$ (ethane), $C_3H_6$ (propylene), $C_3H_8$ (propane), and $C_3H_4$ (propyne).

Also, in some embodiments, a hydrofluorocarbon-containing gas may be supplied as the hydrogen-containing gas. For example, the hydrofluorocarbon-containing gas used may be at least one of $CH_2F_2$ (methane difluoride), $CH_3F$ (fluoromethane), and $CHF_3$ (trifluoro methane).

Also, in some embodiments, a fluorocarbon-containing gas may be added to the sulfur fluoride-containing gas and the hydrogen-containing gas as the supplied gas. For example, the fluorocarbon-containing gas that is added may be at least one of $CF_4$ (carbon tetrafluoride), $C_3F_8$ (propane octafluoride), $C_2F_4$ (tetrafluoroethylene), $C_3F_6$ (hexafluoropropene), $C_4F_6$ (hexafluoro-1,3-butadiene), and $C_4F_8$ (cyclobutane octafluoride).

Also, the laminated film 12 made up of laminated layers of a silicon oxide ($SiO_2$) film and a silicon nitride (SiN) film is merely one example of a laminated film made up of laminated layers of silicon-containing films having different compositions. In other embodiments, a laminated film made up of polysilicon and $SiO_2$ films may be used, for example.

Also, the etching process method according to the present invention is not limited to being implemented in the parallel plate type dual frequency plasma processing apparatus as shown in FIG. 1 but may also be implemented in other plasma processing apparatuses. Examples of other plasma processing apparatuses include a capacitively coupled plasma (CCP) apparatus, an inductively coupled plasma (ICP) processing apparatus, a plasma processing apparatus using a radial line slot antenna, a helicon wave plasma (HWP) apparatus, an electron cyclotron resonance plasma (ECR) apparatus, a surface wave plasma processing apparatus, and the like.

Also, although the semiconductor wafer W is described as an example substrate to be processed, various other types of substrates, such as a substrate used in an LCD (Liquid Crystal Display) or a FPD (Flat Panel Display), a photomask, a CD substrate, or a printed circuit board, may be subjected to the etching process method according to the present invention.

Further, note that an etching process method according to an embodiment of the present invention may be advantageously implemented in an etching process for forming a deep hole or a deep trench in a laminated film made up of laminated layers of silicon-containing films having different compositions using a plasma generated from a sulfur fluoride-containing gas and a hydrogen-containing gas to fabricate a three-dimensional (3D) stacked semiconductor memory, such as a 3D NAND flash memory, having an aspect ratio of at least 20, for example.

What is claimed is:

1. An etching process method comprising:
   outputting a first high frequency power from a first high frequency power supply in an environment where a temperature of the substrate is controlled to be less than or equal to −35° C.;
   supplying a sulfur fluoride-containing gas and a hydrogen-containing gas;
   generating a plasma from the supplied sulfur fluoride-containing gas and hydrogen-containing gas;
   etching a laminated film made up of laminated layers of silicon-containing films having different compositions, the silicon-containing films including a $SiO_2$ (silicon-oxide) film, with the generated plasma, wherein the supplied sulfur fluoride-containing gas and hydrogen-containing gas does not include a gas having carbon, and
   introducing a substrate including laminated layers of $SiO_2$ (silicon-oxide) films and SiN (silicon nitride) films that are alternately laminated on each other and a mask film formed on the laminated layers into a chamber,
   wherein the etching etches the $SiO_2$ (silicon-oxide) films and the SiN (silicon nitride) films by the plasma that is generated from the supplied sulfur fluoride-containing gas and hydrogen-containing gas,
   the $SiO_2$ (silicon-oxide) film is etched by liquid hydrofluoric acid that is generated from the supplied sulfur fluoride-containing gas and hydrogen-containing gas, and
   the etching of the $SiO_2$ (silicon-oxide) films is performed by a plasma that is generated from gases that are same as gases by which the etching of the SiN (silicon nitride) films is performed.

2. The etching process method according to claim 1, wherein a hydrocarbon-containing gas is supplied as the hydrogen-containing gas.

3. The etching process method according to claim 2, wherein the hydrocarbon-containing gas is at least one of $CH_4$ (methane), $C_2H_8$, $C_2H_2$ (acetylene), $C_2H_4$ (ethylene), $C_2H_6$ (ethane), $C_3H_6$ (propylene), $C_3H_8$ (propane), and $C_3H_4$ (propyne).

4. The etching process method according to claim 1, wherein a hydrofluorocarbon-containing gas is supplied as the hydrogen-containing gas.

5. The etching process method according to claim 4, wherein the hydrofluorocarbon-containing gas is at least one of $CH_2F_2$ (methane difluoride), $CH_3F$ (fluoromethane), and $CHF_3$ (trifluoro methane).

6. The etching process method according to claim 1 further comprising:
   adding a fluorocarbon-containing gas to the sulfur fluoride-containing gas and the hydrogen-containing gas that are supplied.

7. The etching process method according to claim 6, wherein the fluorocarbon-containing gas is at least one of $CF_4$ (carbon tetrafluoride), $C_3F_8$ (propane octafluoride), $C_2F_4$ (tetrafluoroethylene), $C_3F_6$ (hexafluoropropene), $C_4F_6$ (hexafluoro-1,3-butadiene), and $C_4F_8$ (cyclobutane octafluoride).

8. The etching process method according to claim 1, wherein the sulfur fluoride-containing gas is $SF_6$ (sulfur hexafluoride).

9. The etching process method according to claim 1, further comprising:
   controlling an internal pressure of a processing chamber in which etching is performed on the laminated film to 15 to 25 mTorr.

10. The etching process method according to claim 1, wherein the method further comprises:
    repeating a cycle of switching the first high-frequency power and a second high-frequency power that is lower than the first high-frequency power on and off synchronously during the etching process.

11. The etching process method according to claim 1, wherein the method further comprises:
    forming a protective film, during the etching, on the side wall of an etched hole, the protective film including sulfur from the sulfur fluoride-containing gas.

12. The etching process method according to claim 1, wherein the mask film is an amorphous carbon film.

13. The etching process method according to claim 1, wherein the method further comprises controlling a temperature of an internal wall of the chamber to be equal to or above 70° C.

14. The etching process method according to claim 1, wherein the hydrogen-containing gas includes one of $H_2$, HF and $NH_3$.

15. The etching process method according to claim 1, wherein the method further comprises controlling the temperature of the substrate at less than or equal to −35° C. throughout the etching.

* * * * *